United States Patent [19]

Hachisuka et al.

[11] Patent Number: 5,300,444
[45] Date of Patent: Apr. 5, 1994

[54] METHOD OF MANUFACTURING A SEMICONDUCTOR DEVICE HAVING A STACKED STRUCTURE FORMED OF POLYCRYSTALLINE SILICON FILM AND SILICON OXIDE FILM

[75] Inventors: Atsushi Hachisuka; Masao Nagatomo; Ikuo Ogoh; Hideki Genjou; Yoshinori Okumura; Takayuki Matsukawa, all of Hyogo, Japan

[73] Assignee: Mitsubishi Denki Kabushiki Kaisha, Tokyo, Japan

[21] Appl. No.: 693,505

[22] Filed: Apr. 30, 1991

Related U.S. Application Data

[62] Division of Ser. No. 405,167, Sep. 11, 1989.

[30] Foreign Application Priority Data

Sep. 14, 1988 [JP] Japan .................. 63-230818

[51] Int. Cl.$^5$ ............................. H01L 21/265
[52] U.S. Cl. ........................ 437/29; 437/193; 437/228; 437/238
[58] Field of Search ............ 437/47, 48, 52, 233, 437/235, 238, 228, 29, 193; 357/51, 23.5, 23.6; 447/41, 44, 45; 257/296-313

[56] References Cited

U.S. PATENT DOCUMENTS

| | | | |
|---|---|---|---|
| 4,394,401 | 7/1983 | Shioya et al. | |
| 4,455,737 | 6/1984 | Godejahn, Jr. | 437/41 |
| 4,546,535 | 10/1985 | Shepard | |
| 4,584,205 | 4/1986 | Chen et al. | |
| 4,754,313 | 6/1988 | Takemae et al. | 357/23.6 |
| 4,789,644 | 12/1988 | Meda | 437/41 |
| 4,845,047 | 7/1989 | Holloway et al. | |
| 4,851,361 | 7/1989 | Schumann et al. | 437/43 |
| 4,851,370 | 7/1989 | Doklan et al. | 437/225 |
| 4,855,801 | 8/1989 | Kuesters | 357/23.6 |
| 4,905,064 | 2/1990 | Yabu et al. | 357/51 |
| 5,028,566 | 7/1991 | Lagendijk | 437/235 |
| 5,087,951 | 2/1992 | Chang et al. | 257/296 |

FOREIGN PATENT DOCUMENTS

| | | | |
|---|---|---|---|
| 53-108381 | 9/1978 | Japan | 437/235 |
| 63-44756 | 2/1983 | Japan | |
| 62-173738 | 7/1987 | Japan | |

OTHER PUBLICATIONS

Su, "Low Temperature Silicon Processing Techniques for VLSIC Fab." in Solid State Technology, Mar. 1981, pp. 72-82.

H. L. Peek, "The Characterization and Technology of Deposited Oxides for EEPROM" Edited by Vermeij et al., 1983, New York, pp. 261-265.

Sze, "Deposition Process in VLSI Technology" second edition 1983, Graw Hill Series in EE, NY, pp. 235-261.

S. M. Sze, VLSI Technology, 1983, p. 119.

(List continued on next page.)

Primary Examiner—Olik Chaudhuri
Assistant Examiner—H. Jey Tsai
Attorney, Agent, or Firm—Lowe, Price, LeBlanc & Becker

[57] ABSTRACT

A semiconductor memory device comprising memory cells having stacked capacitors has a stacked structure formed by the selective removal of a polycrystalline silicon film (15; 20) and a silicon oxide film (18a; 18), employing the same mask (14). A field effect transistor connected to a stacked capacitor has a gate electrode (20) formed of the above described polycrystalline silicon film. This polycrystalline silicon film (20) is formed on the major surface of a semiconductor substrate. The above described silicon oxide film (18) as an upper layer insulating film formed on the gate electrode (20) has a residual stress not more than $10^9$ dyn/cm$^2$. No notches occur in the polycrystalline silicon film (20) in the process of selectively removing the polycrystalline silicon film (15) and the silicon oxide film (18a) deposited thereon, employing the same mask (14), thereby not decreasing the operation speed of the field effect transistor having the gate electrode (20) formed of the polycrystalline silicon film.

20 Claims, 8 Drawing Sheets

OTHER PUBLICATIONS

Sze, "VLSI Technology" second edition 1988, McGraw Hill Book Company, pp. 248–265, New York.

Peng et al., "Optimization of Submicron Polysilicon Etching and the Effect of Organic and Inorganic Masks, and Their Aspect Ratios," *J. Electrochem. Soc.: Solid-State Science and Technology*, vol. 133, No. 7, (Jul. 1986), pp. 1479–1484.

Levin et al., "Oxide Isolation for Double-Polysilicon VLSI Devices," *J. Electrochem. Soc.: Solid-State Science and Technology*, vol. 130, No. 9 (Sep. 1983), pp. 1894–1897.

Smolinsky et al., "Measurements of Temperature Dependent Stress of Silicon Oxide Films Prepared by a Variety of CVD Methods," *J. Electrochem. Soc.: Solid-State Science and Technology*, vol. 132, No. 4 (Apr. 1985), pp. 950–954.

Chin et al., "Plasma TEOS Process for Interlayer Dielectric Applications," *Solid State Technology*, Apr. 1988, pp. 119–122.

Peccoud et al., "New trends and limits in plasma etching," *J. Phys. D.: Appl. Phys.*, vol. 20 (1987), pp. 851–857.

Cardinaud et al., "Contamination of Silicon Surfaces Exposed to $CHF_3$ Plasmas; An XPS Study of the Film and the Film-Surface Interface," *Journal of the Electrochemical Society*, Jun. 1988, pp. 1472–1477.

Engelhardt et al., "A New $CBrF_3$ Process for Etching Tapered Trenches in Silicon," *Journal of the Electrochemical Society*, Aug. 1987, pp. 1985–1988.

Gualandris et al., "Some etch properties of doped and undoped silicon oxide films formed by atmospheric pressure and plasma-activated chemical vapor distillation," *J. Vac. Sci. Technol.* B3 (6), Nov./Dec. 1985, pp. 1604–1608.

Sakai et al., "Tolpography Modeling in Dry Etching Processes," *J. Electrochem. Soc.: Solid-State Science and Technology*, vol. 131, No. 3 (Mar. 1984), pp. 627–632.

Koyanagi et al., "Novel High Density, Stacked Capacitor MOS RAM," Central Research Laboratory, Hitachi LTD., *IEDM Digest of Technical Papers*, 1978, pp. 348–351.

METHOD OF MANUFACTURING A SEMICONDUCTOR DEVICE HAVING A STACKED STRUCTURE FORMED OF POLYCRYSTALLINE SILICON FILM AND SILICON OXIDE FILM

This application is a division of application Ser. No. 07/405,167, filed Sep. 11, 1989.

BACKGROUND OF THE INVENTION

1. Field of the Invention

The present invention relates to semiconductor devices and a manufacturing method thereof-, and more particularly to semiconductor devices each having a stacked structure formed by selectively removing a polycrystalline silicon film and a silicon oxide film, employing the same mask, and to a manufacturing method thereof. The present invention is particularly applicable to a dynamic type random access memory having memory cells of stacked capacitor structures.

2. Description of the Background Art

Figure 3:
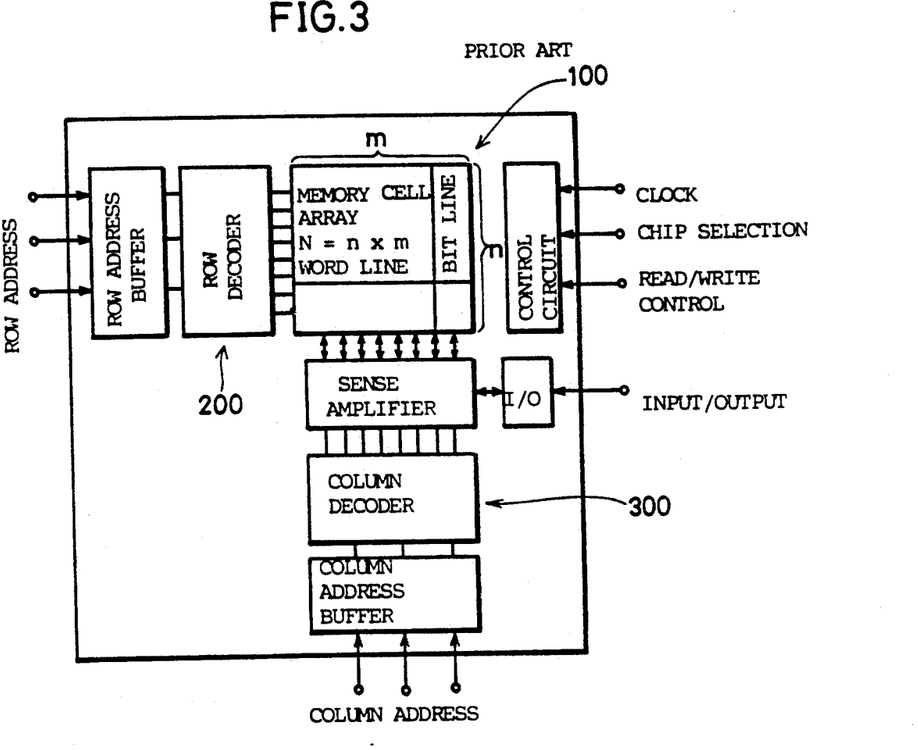
FIG. 3 is a block diagram illustrating the entire configuration of a conventional DRAM.

Since the present invention can attain the most desirable effect when applied to a dynamic type random access memory (hereinafter referred to as a DRAM) having memory cells of stacked capacitor structures, a DRAM having memory cells of the stacked capacitor structures will be described. The DRAM has been already well known. FIG. 3 is a block diagram illustrating one example of the entire configuration of the conventional DRAM.

Referring to FIG. 3, the DRAM comprises a memory cell array 100 including a plurality of memory cells, which are of a storage portion, a row decoder 200 and a column decoder 300 connected to their respective address buffers selecting addresses of the memory cells, and an input/output interface portion including a sense amplifier connected to an input/output circuit. The plurality of memory cells being the storage portion are provided in a matrix of a plurality of rows and columns. Each of the memory cells is connected to a corresponding word line connected to the row decoder 200 and to a corresponding bit line connected to the column decoder 300, thereby constituting the memory cell array 100. A memory cell is selected by the respective one of the word lines and bit lines selected by the row decoder 200 and the column decoder 300 in response to a row address signal and a column address signal externally supplied. Data is written in the memory cell selected, and the data stored in the memory cell is read. Instructions of the data reading/writing are carried out by read/write control signals applied to a control circuit.

The data is stored in the memory cell array 100 of N (=n×m) bits. Address information of the memory cell in which read/write are carried out is stored in the row and column address buffers, and by selection of a particular word line by the row decoder 200 (selection of one from n word lines), m-bit memory cells are coupled to the sense amplifiers via the bit lines. Next, by selection of a particular bit line by the column decoder 300 (selection of one from m-bit lines), one of the sense amplifiers is coupled to the input/output circuit to carry out read or write according to the instructions of the control circuit.

Figure 4:
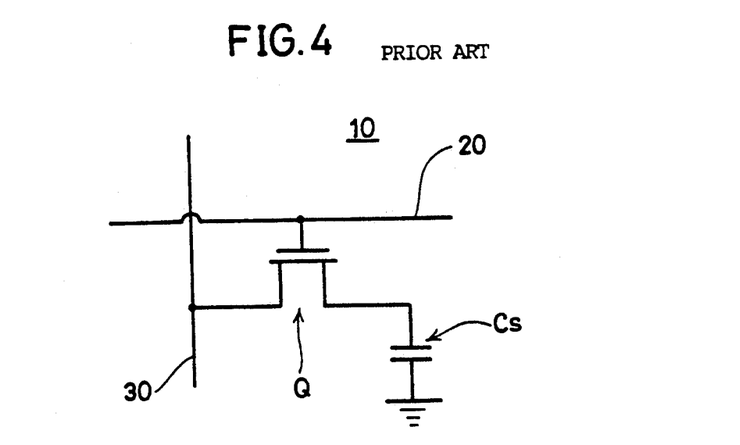
FIG. 4 is an equivalent circuit diagram corresponding to one memory cell of the DRAM shown in FIG. 3.

FIG. 4 is an equivalent circuit diagram of one memory cell 10 of the DRAM illustrated for the description of write/read operations of the memory cells. According to this figure, the memory cell 10 comprises a field effect transistor Q and a capacitor Cs. The field effect transistor Q has a gate electrode connected to the word line 20, one source/drain electrode connected to one electrode of the capacitor Cs, and the other source/drain electrode connected to the bit line 30. In data writing, since the field effect transistor Q is rendered conductive when a prescribed voltage is applied to the word line 20, a charge applied to the bit line 30 is stored in the capacitor Cs. In data reading, the field effect transistor Q is rendered conductive when a prescribed voltage is applied to the word line 20, the charge stored in the capacitor Cs is taken out via the bit line 30.

Figure 5:
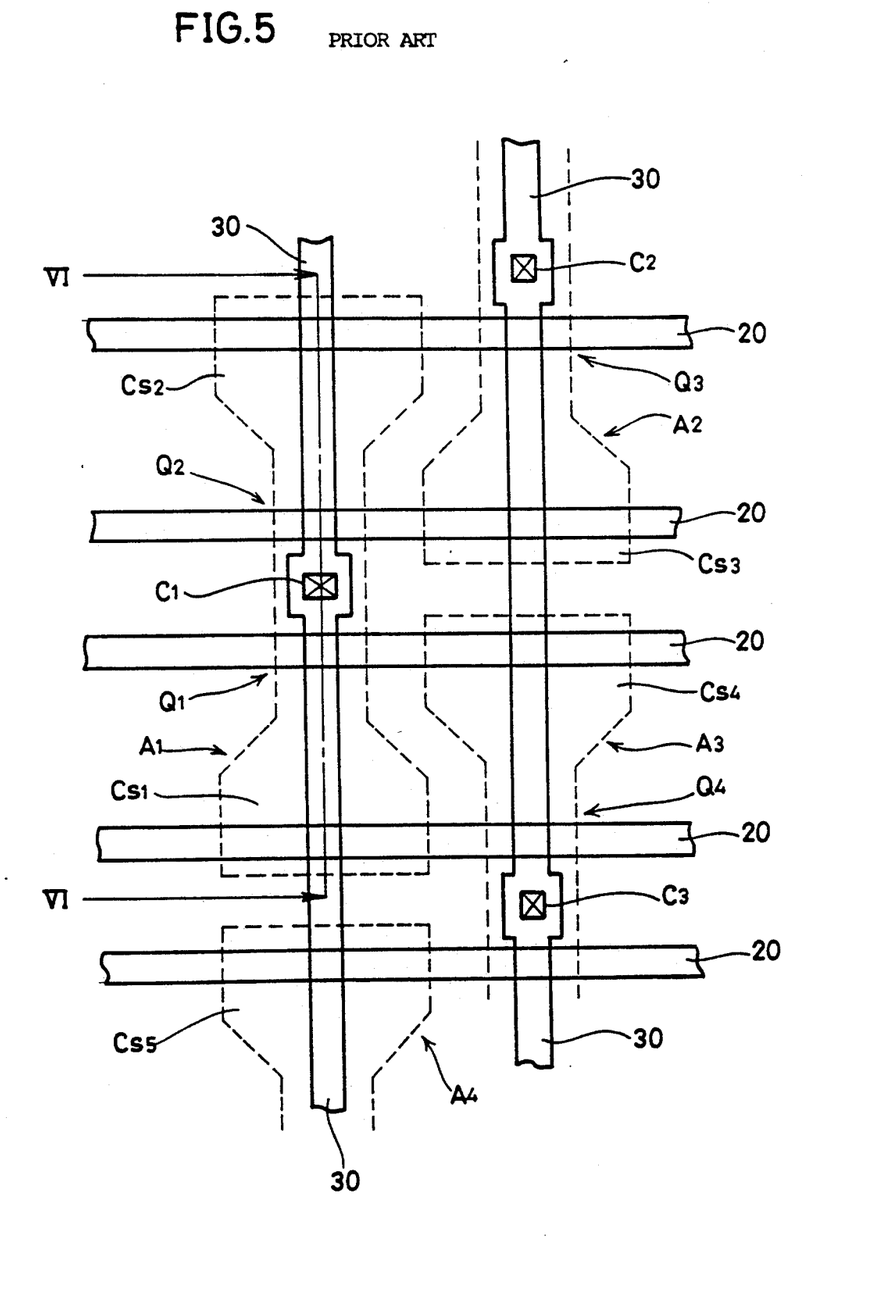
FIG. 5 is a fragmentary plan view illustrating a memory cell forming region of the conventional DRAM.

FIG. 5 is a fragmentary plan view illustrating a planar arrangement of a memory cell array portion of the DRAM of a folded bit line scheme. FIG. 5 illustrates four memory cells, and typically illustrates two of the memory cells respectively formed of two sets of field effect transistors and capacitors, Q1 and Cs1, Q2 and Cs2 which are formed on an operation region Al separated from the adjacent memory cells. The gate electrodes of the respective transistors Q1, Q2, Q3, Q4 are connected to the word lines 20 corresponding to the respective memory cells. The bit lines 30 are formed on the word lines 20 to be insulated from and intersecting the word lines 20. The bit lines 30 are connected to the memory cells through contact holes C1, C2, C3. A cross section taken along the line VI—VI of FIG. 5 is illustrated in processing steps in the FIGS. 6A–6M. A method of manufacturing the DRAM having conventional stacked capacitors will now be described. The DRAM having the stacked capacitors is, for example, disclosed in IEDM Digest of Technical Papers (1978), pp. 348–351 by M. Koyanagi et al. Further, a manufacturing method thereof is, for example, disclosed in Japanese Patent Laying Open No. 63-44756.

Figure 6A:
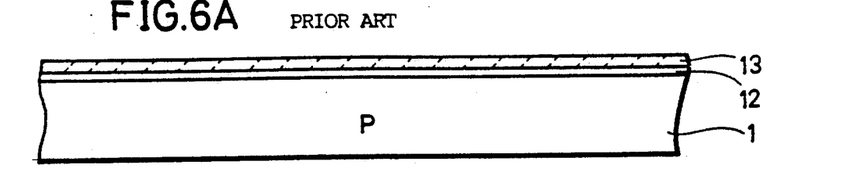
FIGS. 6A–6M are fragmentary cross sectional views illustrating in processing steps a method of manufacturing the conventional semiconductor memory device.

First of all, referring to FIG. 6A, an underlying oxide film 12 is formed on a P type silicon substrate 1 such as by a thermal oxidation method. A nitride film 13 is formed on the underlying oxide film 12 such as by chemical vapor deposition (CVD) method.

Figure 6B:
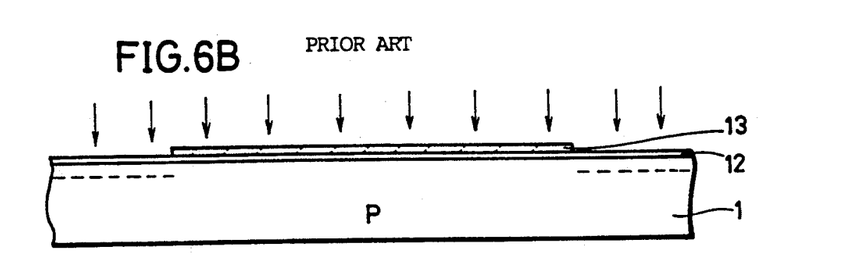

Next, referring to FIG. 6B, after a resist film is deposited on the nitride film 13, the nitride film 13 is selectively removed following a prescribed pattern. With the patterned nitride film 13 used as a mask, P type impurity ion, eg. boron ion is implanted into the P type silicon substrate 1 in a direction shown by arrows, at an acceleration voltage of approximately 10–200keV.

Figure 6C:
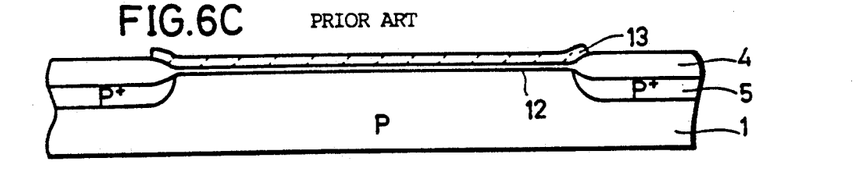

Furthermore, referring to FIG. 6C, by the thermal oxidation process performed with the nitride film 13 used as a mask, a field oxide film 4 for isolation is formed on the ion-implanted P type silicon substrate 1, and a P type impurity diffusion region 5 for channel stopper is formed beneath the field oxide film 4 for isolation by thermal diffusion of the implanted P type impurity ion.

Figure 6D:
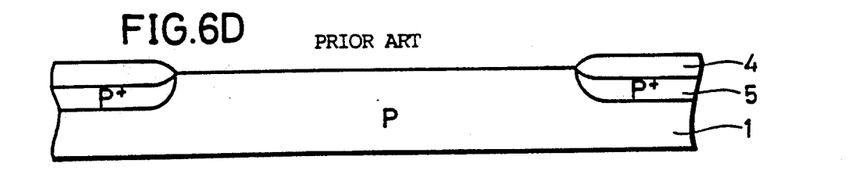

Referring to FIG. 6D, the nitride film 13 and underlying oxide film 12 are then removed by etching.

Figure 6E:
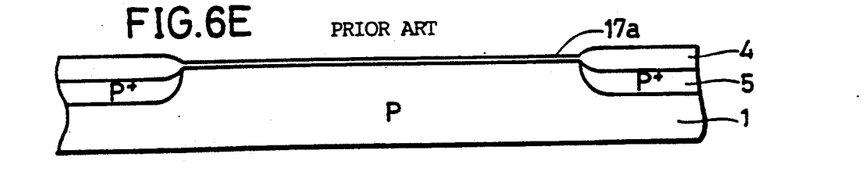

As shown in FIG. 6E, an insulating film 17a made of an oxide film is formed by thermal oxidation, for example.

Figure 6F:
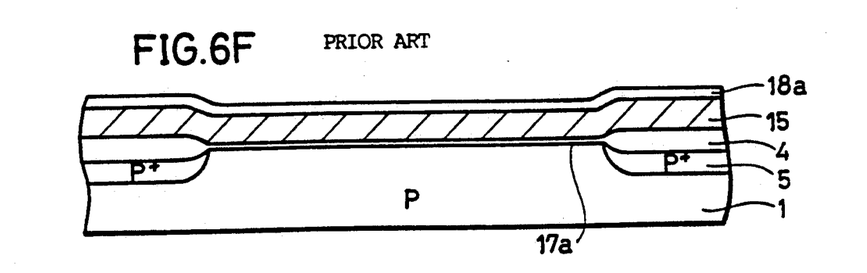

As shown in FIG. 6F, a polysilicon film 15 is deposited on the entire surface such as by the chemical vapor deposition method. Further, by employing SiH$_4$, N$_2$O as a raw gas, a silicon oxide film 18a as an upper layer insulating film is deposited on the polysilicon film 15 at a temperature of 850° C. by the chemical vapor deposition method. The silicon oxide film deposited by this method is called a high temperature oxide film (an HTO film).

Figure 6G:
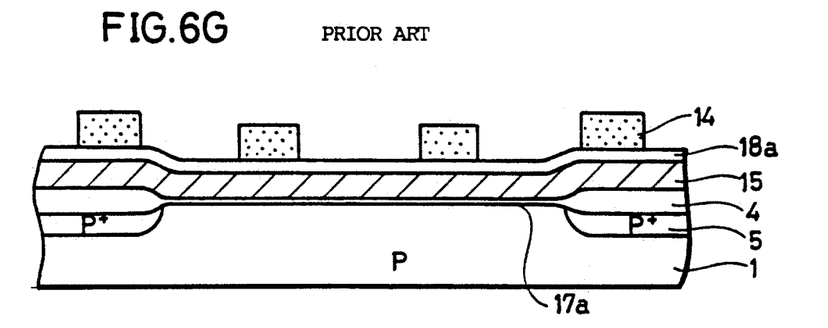

As shown in FIG. 6G, a resist film 14 is then formed on the silicon oxide film 18a according to the prescribed pattern.

Figure 6H:
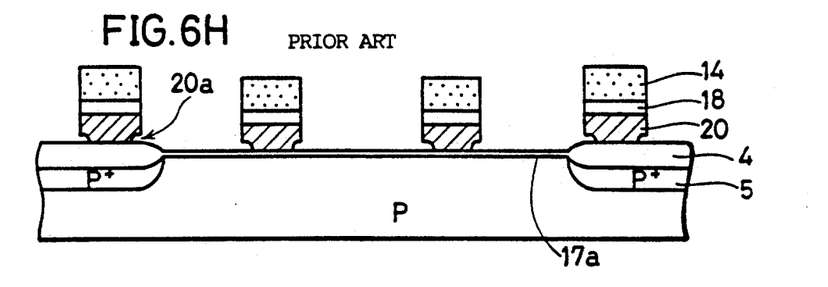

Referring to FIG. 6H, with the resist film 14 used as a mask, the silicon oxide film 18a, which is a high temperature oxide film is removed, such as by dry etching employing an etching gas including a $CHF_3$ gas as its principal material, and the polysilicon film 15 is removed by dry etching employing an etching gas including $CCl_4$ gas as its principal material. As described above, an upper layer insulating film 18 and a word line 20 as a gate electrode are formed. However, notches 20a are formed in the lower part of the word line 20 by the above described etching.

Figure 6I:
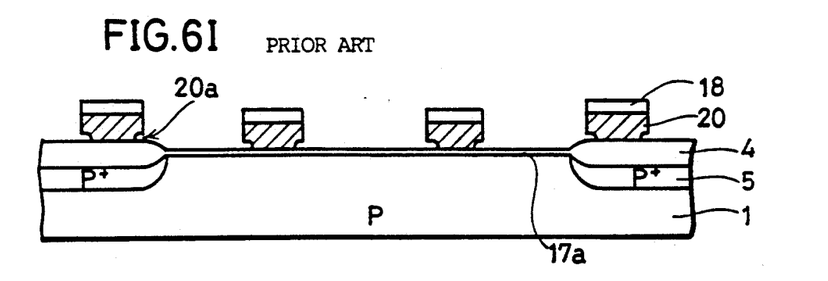

The resist film 14 is then removed as shown in FIG. 6I.

Figure 6J:
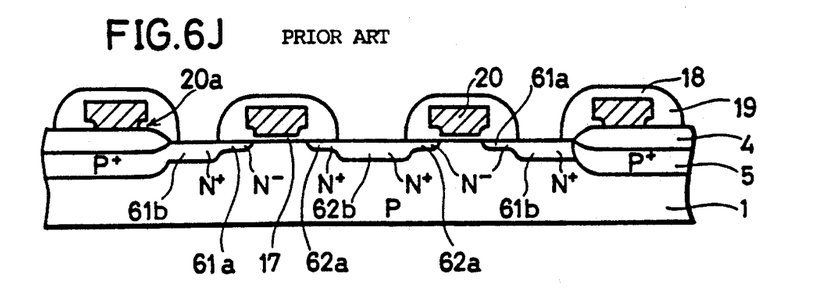

As shown in FIG. 6J, N type impurity diffusion regions 61a, 62a of low concentration are formed by implantation of N type impurity ion with the word line 20 used as mask, and thereafter, a sidewall insulating film 19 is formed on the sidewall of the word line 20. N type impurity diffusion regions 61b, 62b of high concentration are formed by implantation of the N type impurity ion again, with the word line 20 and sidewall insulating film 19 used as masks. An N channel type MOS transistor having a LDD structure is formed as described above. That is, N type impurity diffusion regions 61, 62 are formed which are constituted by the N type impurity diffusion regions 61a, 62a of low concentration and the N type impurity diffusion regions 61b, 62b of high concentration to be source/drain regions.

Figure 6K:
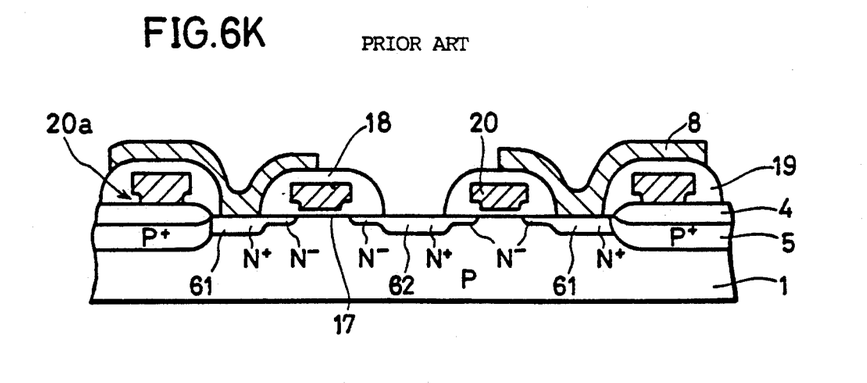

Next, referring to FIG. 6K, a storage node 8 made of a conductive material such as polysilicon is selectively formed to connect with each of the N channel type MOS transistors.

Figure 6L:
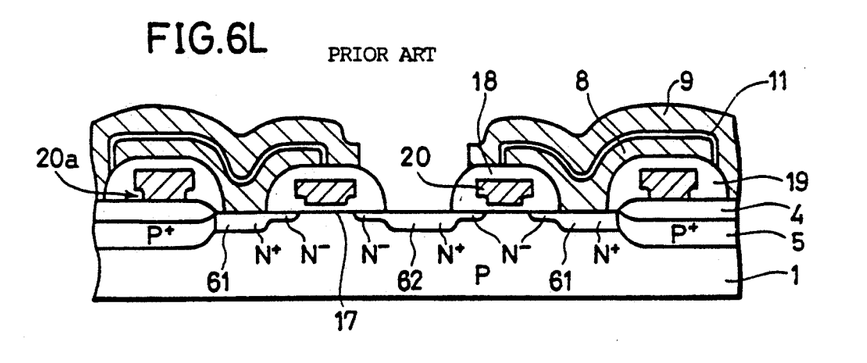

Referring to FIG. 6L, a capacitor dielectric film 11 made of a silicon oxide film, a nitride film etc. is formed on the storage node 8. A cell plate 9 made of a conductive material such as polysilicon is formed on the capacitor dielectric film 11. As mentioned above, a stacked capacitor constituted by the storage node 8, the capacitor dielectric film 11 and the cell plate 9 is formed to connect with one N type impurity diffusion region 61 of the N channel MOS transistor.

Figure 6M:
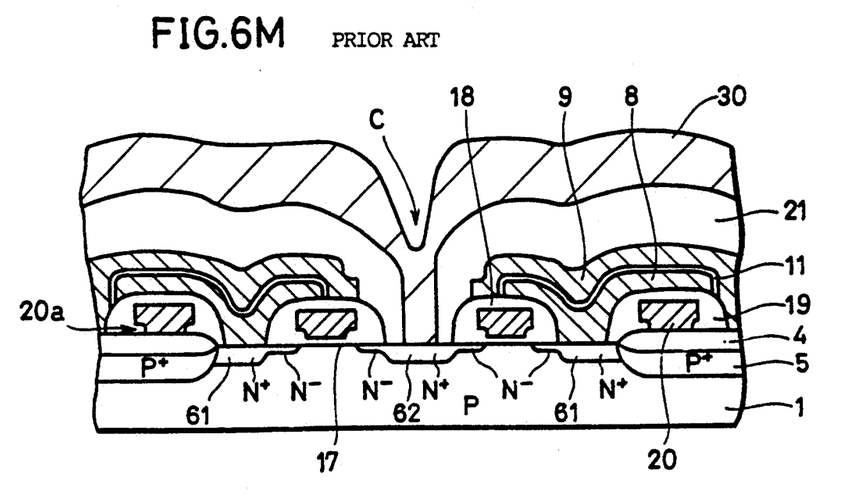

Finally, as shown in FIG. 6M, after an interlayer insulating film 21 made of such as an oxide film, a contact hole C is made to connect with the other N type impurity diffusion region 62 of the N channel type MOS transistor. A bit line 30 made of such as an aluminum layer is formed to connect with the N type impurity diffusion region 62 through this contact hole C.

The DRAM having memory cells of the stacked capacitor structures is formed as described heretofore.

In the DRAM having memory cells of the conventional stacked capacitor structures, when the word line as a gate electrode and the upper layer insulating film formed thereon are selectively removed by employing the same mask, portions of the lower part of the word line are cut out to form notches therein. There is a problem that as the notches exist in the word line as a gate electrode, channel resistance increases in the operation of the MOS transistor. This results from the fact that since no impurity diffusion region is formed in a region directly beneath the notches formed in the lower part of the gate electrode, the region becomes a high resistance portion in the operation of the transistor, so that an inversion layer is hard to be formed. Therefore, there is a problem of decreased operation speed in the MOS transistor.

SUMMARY OF THE INVENTION

It is an object of the present invention to provide a semiconductor device having a stacked structure formed of a polycrystalline silicon film and a silicon oxide film deposited thereon, without any notches on the polycrystalline silicon film.

It is another object of the present invention to provide a semiconductor device without decreased operation speed comprising field effect transistors each having a stacked structure formed of a gate electrode made of a polycrystalline silicon film and a silicon oxide film as an upper layer insulating film formed thereon.

It is a further object of the present invention to provide a semiconductor memory device comprising memory cells having stacked capacitors without decreased operation speed.

It is a still further object of the present invention to provide a method of manufacturing a semiconductor device having no notches in a polycrystalline silicon film thereof in a process of selectively removing the polycrystalline silicon film and a silicon oxide film deposited thereon by employing the same mask.

It is a further object of the present invention to provide a method of manufacturing a semiconductor device having field effect transistors without decreased operation speed resulting from no notches occurring in each of the gate electrodes thereof, in a process of selectively removing a polycrystalline silicon film as a gate electrode constituting a field effect transistor and a silicon oxide film as an upper layer insulating film formed thereon by employing the same mask.

It is a still further object of the present invention to provide a method of manufacturing a semiconductor memory device comprising memory cells having stacked capacitors without decreased operation speed.

A semiconductor device according to the present invention comprises a semiconductor substrate, a polycrystalline silicon film and a silicon oxide film. The semiconductor substrate has a major surface. The polycrystalline silicon film is formed on the major surface of the semiconductor substrate. The silicon oxide film is formed on the polycrystalline silicon film. Further, the silicon oxide film has a residual stress not more than $10^9$ $dyn/cm^2$.

Moreover, according to a method of manufacturing the semiconductor memory device in accordance with the present invention, the polycrystalline silicon film is first formed on the major surface of the semiconductor substrate. The silicon oxide film is formed on the polycrystalline silicon film at a temperature ranging from normal temperature to 800° C. The silicon oxide film formed thereby has a residual stress not more than $10^9$ $dyn/cm^2$. After that, the polycrystalline silicon film and silicon oxide film are selectively removed by employing the same mask.

In the present invention, the silicon oxide film formed on the polycrystalline silicon film has a residual stress therein not more than $10^9$ $dyn/cm^2$. Accordingly, the residual stress of the silicon oxide film does not cause any notches in the polycrystalline silicon film directly beneath the silicon oxide film.

In addition, according to a manufacturing method of the present invention, the silicon oxide film is formed on the polycrystalline silicon film at a temperature of 800° C. or below. Accordingly, the residual stress of the silicon oxide film can be limited to not more than $10^9$ dyn/cm$^2$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will now be described with reference to the figures.

FIGS. 1A–1M are fragmentary cross sectional views illustrating in processing steps one example of a method of manufacturing a semiconductor memory device in accordance with the present invention, for example, a method of manufacturing a DRAM having memory cells of stacked capacitor structures.

Figure 1A:
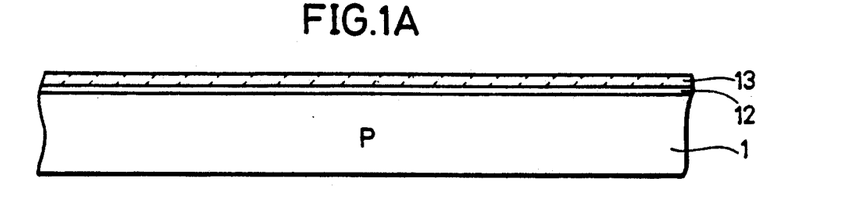
FIGS. 1A–1M are fragmentary cross sectional views illustrating in processing steps one embodiment of a method of manufacturing a semiconductor memory device in accordance with the present invention.

First of all, referring to FIG. 1A, an underlying oxide film 12 is formed on a P type silicon substrate 1 such as by a thermal oxidation method. A nitride film 13 is formed on the underlying oxide film 12 such as by a chemical vapor deposition method.

Figure 1B:
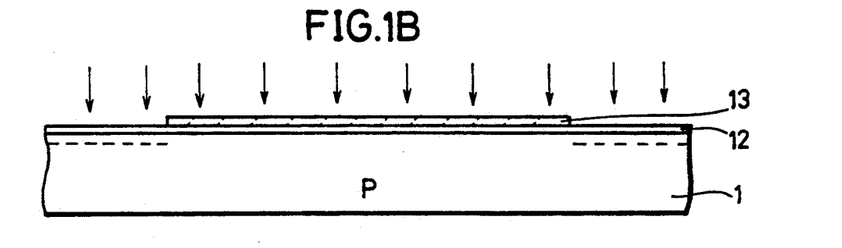

Next, referring to FIG. 1B, the nitride film 13 is selectively removed following a prescribed pattern. By employing the patterned nitride film 13 as a mask, P type impurity ion such as boron ion is implanted in the P type silicon substrate 1 in a direction shown by arrows at an acceleration voltage of 10–200keV.

Figure 1C:
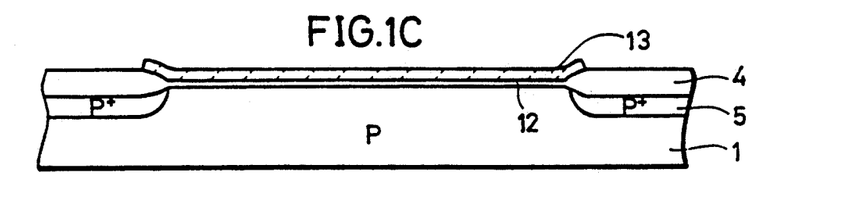

Further, referring to FIG. 1C, a thermal oxidation processing is applied with the nitride film 13 used as a mask. Accordingly, a field oxide film 4 for isolation is formed on the ion-implanted P type silicon substrate 1, and a P type impurity diffusion region 5 for channel stopper is formed in a region beneath the field oxide film 4 for isolation by thermal diffusion of P type impurity ion.

Figure 1D:
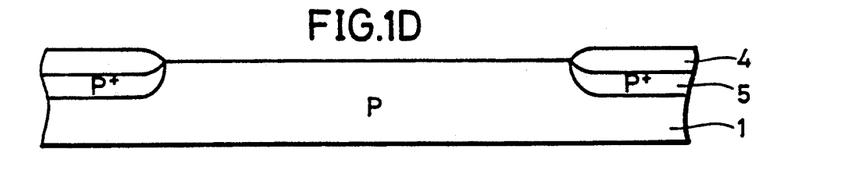

Referring to FIG. 1D, the nitride film 13 and the underlying oxide film 12 are then removed by etching.

Figure 1E:
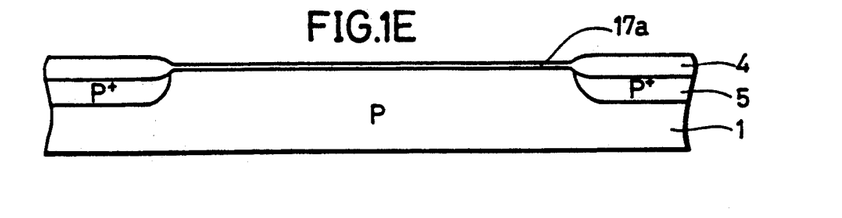

As shown in FIG. 1E, an insulating film 17a made of an oxide film is formed such as by the thermal oxidation method.

Figure 1F:
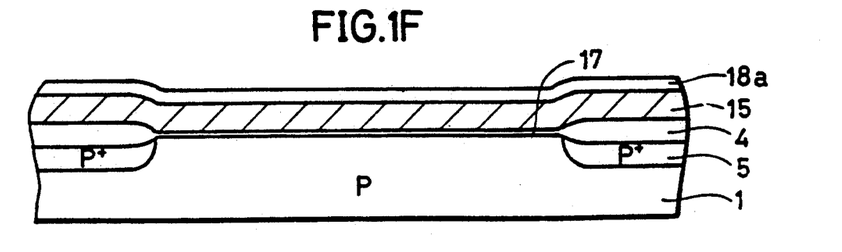

As shown in FIG. 1F, a polysilicon film 15 is deposited on the entire surface such as by the chemical vapor deposition method. Further, a silicon oxide film 18a as the upper layer insulating film is deposited on the polysilicon film 15 at the temperature ranging from normal temperature 750° C., e.g. at 720° C. by the chemical vapor deposition method, by the use of tetraethoxy ortho silicate (Si (OC$_2$H$_5$)$_4$) as a raw gas. The silicon oxide film 18a deposited as above is called a TEOS film. A residual stress of the TEOS film is a tensile stress not more than $5 \times 10^8$ dyn/cm$^2$ after formation of the film, and is a compressive stress not more than $1 \times 10^9$ dyn/cm$^2$ after thermal processing in the subsequent step. Further, the residual stress of a high temperature oxide film (HTO film) formed at the conventional temperature of 800° C. or above is not more than $2 \times 10^9$ dyn/cm$^2$, which shows a higher value than the TEOS film.

Moreover, an example in which the TEOS film is formed on a BPSG film filled in an insulating isolation trench is disclosed in Japanese Patent Laying Open No. 62-173738. However, this example only describes an effect of the TEOS film in a decreased internal stress applied to the substrate.

Figure 1G:
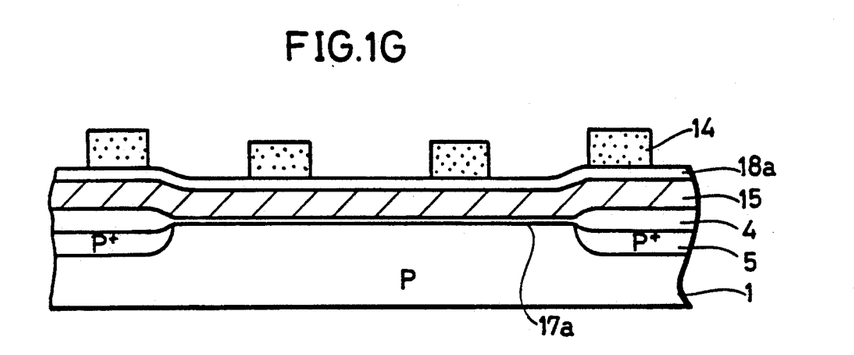

In addition, as shown in FIG. 1G, a resist film 14 is formed on the silicon oxide film 18a constituted by the TEOS film according to a prescribed pattern.

Figure 1H:
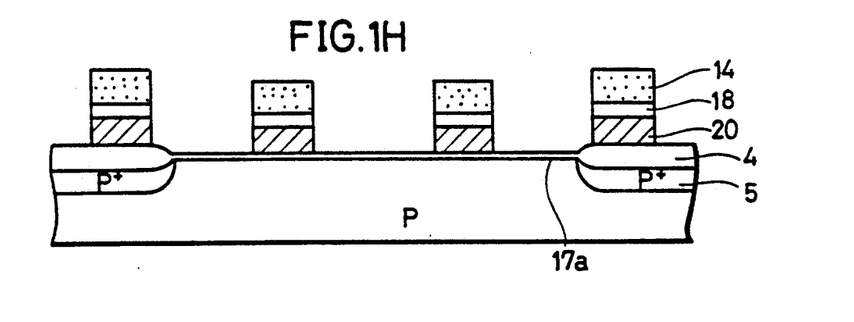
Figure 1I:
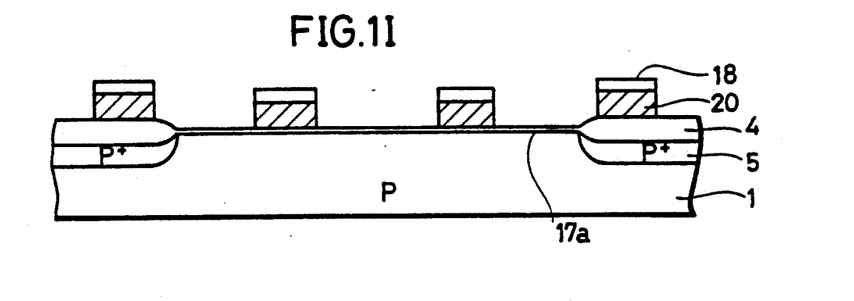

As shown in FIG. 1H, with the resist film 14 used as a mask, the silicon oxide film 18a with a thickness of approximately 2500Å made of the TEOS film and the polysilicon film 15 with a thickness of 2000 to 3000Å are selectively removed by dry etching. At this time, since the silicon oxide film 18a formed on the polysilicon film 15 has residual stress not more than $10^9$ dyn/cm$^2$, a word line 20 as a gate electrode is formed without any notches therein as shown in FIG. 6H, in this etching process. Referring to FIG. 1I, an upper layer insulating film 18 and the word line 20 are formed by removal of the resist film 14.

Figure 1J:
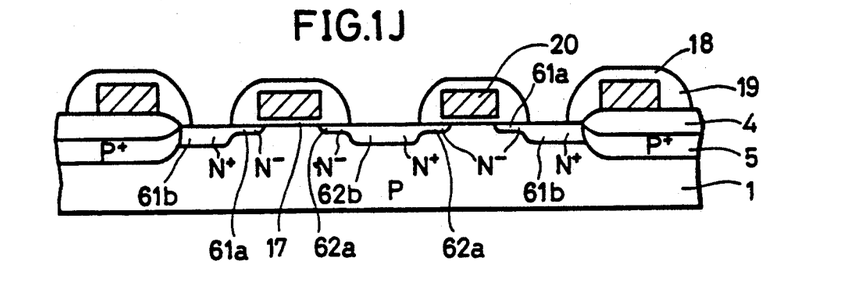
Figure 1K:
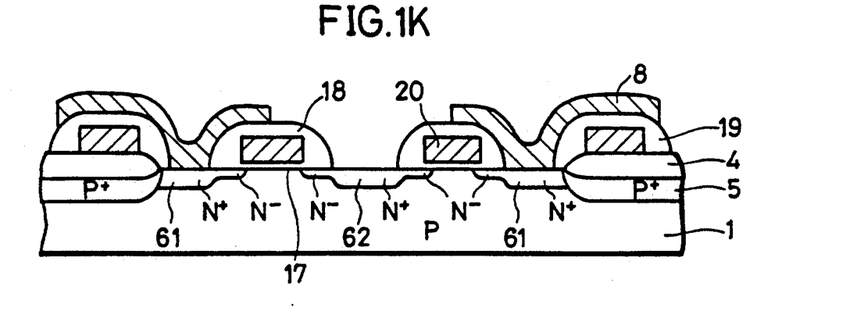

Next, as shown in FIG. 1J, with the word line 20 used as a mask, N type impurity diffusion regions 61a, 62a of low concentration are formed by implantation of the N type impurity ion into the P type silicon substrate 1. Further, after a sidewall insulating film 19 is formed on the sidewalls of the word line 20, N type impurity diffusion regions 61b, 62b of high concentration are formed by implantation of the N type impurity ion in the P type silicon substrate 1, with the word line 20 and sidewall insulating film 19 used as masks. As described above, an N channel type MOS transistor is formed in which N type impurity diffusion regions 61, 62 to be source/drain regions have LDD structures.

As shown in FIG. 1I, a storage node 8 made of a conductive material such as polysilicon contacts to one N type impurity diffusion region 61 and is formed to extend on the upper layer insulating film 18 according to a prescribed pattern to connect with each N channel type MOS transistor.

Figure 1L:
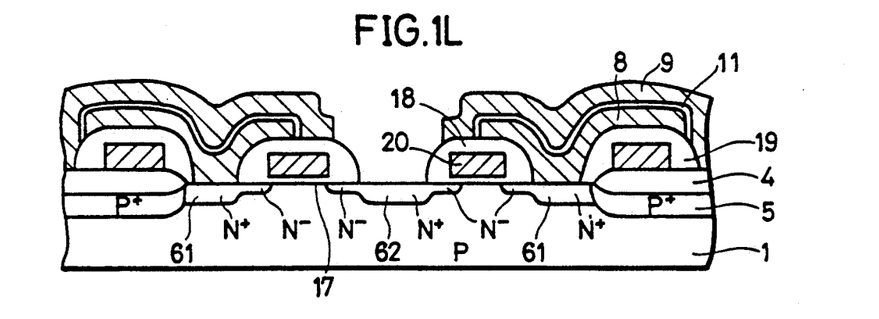

Next, as shown in FIG. 1L, a capacitor dielectric film 11 made of a silicon oxide film and a silicon nitride film etc. is formed to cover the storage node 8. A cell plate 9 made of a conductive material such as polysilicon is formed on the capacitor dielectric film 11. As described above, a stacked capacitor is formed which is constituted by the storage node 8 and the cell plate 9, with the capacitor dielectric film 11 sandwiched therebetween.

Figure 1M:
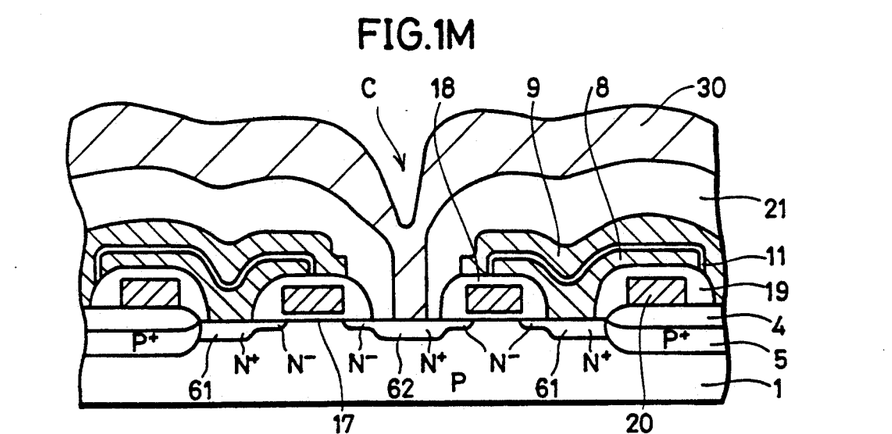

Finally, referring to FIG. 1M, an interlayer insulating film 21 of such as an oxide film is formed on the entire surface. A contact hole C is made through the interlayer insulating film 21 to expose the other N type impurity diffusion region 62 which is not connected to a capacitor cell of the N channel type MOS transistor. A bit line 30 made of such as an aluminum layer is formed through this contact hole C for electrical contact.

As described above, the DRAM can be manufactured which has stacked capacitors without any notches occurring in the word lines as the gate electrodes. Since no notches occur in the word lines, the operation speed of the MOS transistor comprising a memory does not decrease.

In the above mentioned embodiment, the TEOS film is employed as the upper layer insulating film on the polysilicon film constituting the word line; however, if the silicon oxide film is formed to have residual stress not more than $10^9$ dyn/cm$^2$, the upper layer insulating film may be formed employing another raw gas. For example, a silicon oxide film (referred to as an NSG film) may be used which is formed at the temperature ranging from normal temperature to 450° C., employing SiH$_4$, O$_2$ as a raw gas by the chemical vapor deposition method. The residual stress of this silicon oxide film is a tensile stress not more than $5 \times 10^8$ dyn/cm$^2$ after formation of the film, and is a compressive stress not more than $5 \times 10^8$ dyn/cm$^2$ also after thermal processing in the subsequent steps. Furthermore, the TEOS film (referred to as a TEOS+O$_3$ film) may be used which is formed at the temperature ranging from normal temperature to 430° C., employing tetraethoxy ortho silicate (Si (OC$_2$H$_5$)$_4$), O$_3$ as a raw gas by the chemical vapor deposition method. The residual stress of this TEOS+O$_3$ film is a tensile stress not more than $1 \times 10^9$ dyn/cm$^2$.

Figure 2:
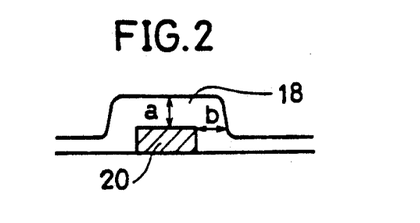
FIG. 2 is a fragmentary cross sectional view illustrating a degree of coverage with a SiO$_2$ film on an underlying film.

The characteristics of the respective SiO$_2$ films described above are shown in Table 1. The evaluation of coverage is shown by a value of b/a as a degree of coverage with the SiO$_2$ film 18 on the underlying film 20 as illustrated in FIG. 2.

TABLE 1

CHARACTERISTICS OF SiO$_2$ FILMS

| CHARACTERISTICS | HTO | TEOS | NSG | TEOS + O$_3$ |
|---|---|---|---|---|
| RESIDUAL STRESS (dyn/cm$^2$) | Tensile Stress not more than $2 \times 10^9$ | Tensile Stress not more than $5 \times 10^8$ (After formation of the film) Compressive Stress not more than $1 \times 10^9$ (After thermal processing) | Tensile Stress not more than $5 \times 10^8$ (After formation of the film) Compressive Stress not more than $5 \times 10^8$ (After thermal processing) | Tensile Stress not more than $1 \times 10^9$ |
| BREAKDOWN VOLTAGE (MV/cm) | 9 | 8 (After formation of the film) 9 (After thermal processing) | 5 (After formation of the film) 8 (After thermal processing) | 5 (After formation of the film) 7 (After thermal processing) |
| ETCHING SPEED (relative value) | 1.5 | 2 (After formation of the film) 1.8 (After thermal processing) | 3 (After formation of the film) 2 (After thermal processing) | 4 (After formation of the film) 2.5 (After thermal processing) |
| COVERAGE (value of b/a) | 0.9 | 1 | 0.7 | 1 |

As an example of the semiconductor memory device having a stacked structure formed by selective removal of the polycrystalline silicon film and the silicon oxide film by employing the same mask, the DRAM having memory cells of the stacked capacitor structures is described in the above mentioned embodiment; however, the semiconductor device having a stacked structure formed of the polycrystalline silicon film and silicon oxide film, which is structured by the selective removal of two layers by employing the same mask achieves the same effect by application of the present invention.

As mentioned heretofore, according to the present invention, since the silicon oxide film existing on the polycrystalline silicon film formed by the selective removal by employing the same mask has a low residual stress, the occurrence of notches on the polycrystalline silicon film of the lower layer can be suppressed. Therefore, a semiconductor device which does not deteriorate the performance of active elements can be provided in case that the polycrystalline silicon film is constituted as a conductive film such as a gate electrode.

What is claimed is:

1. In a method for manufacturing a semiconductor device including the steps of:
    forming a polycrystalline silicon film on the major surface of a semiconductor substrate,
    forming a silicon oxide film on said polycrystalline silicon film,
    forming a resist film on said silicon oxide film, and
    using said resist film as a mask for selectively removing both said silicon oxide film and said polycrystalline silicon film, the improvement comprising:
    preventing formation of notches at a lower surface of the polycrystalline silicon film in the step of using said resist film as a mask,
    said step of preventing notches including executing the step of forming said silicon oxide film on said polycrystalline silicon at a temperature not more than 800° C. whereby the silicon oxide film has a residual stress not more than $10^9$ dyn/cm$^2$.

2. A method of manufacturing a semiconductor device in accordance with claim 1, wherein
    the step of forming said silicon oxide film includes using tetraethoxy ortho silicate as a raw gas.

3. A method of manufacturing a semiconductor device in accordance with claim 1, wherein
    the step of forming said silicon oxide film includes the formation of a silicon oxide film at a temperature ranging from normal temperature to 430° C., using tetraethoxy ortho silicate and O$_3$ as a raw gas.

4. A method of manufacturing a semiconductor device in accordance with claim 1, wherein
    the step of forming said silicon oxide film includes the formation of the silicon oxide film by a chemical vapor deposition method.

5. A method of manufacturing a semiconductor device in accordance with claim 1,
    wherein the step of removing said polycrystalline silicon film and said silicon oxide film includes the formation of a gate electrode constituting a field effect transistor.

6. A method of manufacturing a semiconductor device in accordance with claim 1, wherein
    the step of forming said silicon oxide film includes using a raw gas including silicon and carbon.

7. In a method of manufacturing a field effect transistor on a semiconductor substrate including the steps of:
  forming a thin insulation film on a major surface of said substrate,
  forming a polycrystalline silicon film on said thin insulation film,
  forming a silicon oxide film on said polycrystalline silicon film,
  forming a resist film on said silicon oxide film,
  using said resist film as a mask for selectively removing both said silicon oxide film and said polycrystalline silicon film to form a gate electrode, and
  forming source/drain regions of said transistor in said substrate by implanting ions into said substrate, using said silicon oxide film and said gate electrode as a mask, the improvement comprising:
  preventing formation of notches at a lower surface of the gate electrode in the step of using said resist film as a mask,
  said step of preventing notches including executing the step of forming said silicon oxide film on said polycrystalline silicon film at a temperature not more than 800° C. such that the silicon oxide film has a residual stress not more than $10^9$ dyn/cm$^2$.

8. A method of manufacturing a field effect transistor in accordance with claim 7, wherein
  the step of forming said silicon oxide film includes using a raw gas including silicon and carbon.

9. A method of manufacturing a field effect transistor in accordance with claim 7, wherein
  the step of forming said silicon oxide film includes using tetraethoxy ortho silicate as a raw gas.

10. A method of manufacturing a field effect transistor in accordance with claim 7, wherein
  the step of forming said silicon oxide film includes the formation of the silicon oxide film at a temperature ranging from normal temperature to 430° C., using tetraethoxy ortho silicate and $O_3$ as a raw gas.

11. A method of manufacturing a field effect transistor in accordance with claim 7, wherein
  the step of forming said silicon oxide film includes the formation of the silicon oxide film by a chemical vapor deposition method.

12. A method for manufacturing a semiconductor device as in claim 1, wherein the executing of the step of forming said silicon oxide film produces a silicon oxide film having a residual tensile stress not more than $5 \times 10^8$ dyn/cm$^2$.

13. A method for manufacturing a semiconductor device as in claim 1, wherein the executing of the step of forming said silicon oxide film produces a silicon oxide film having a residual stress not more than $5 \times 10^8$ dyn/cm$^2$.

14. A method of manufacturing a field effect transistor as in claim 7, wherein the executing of the step of forming said silicon oxide film produces a silicon oxide film having a residual tensile stress not more than $5 \times 10^8$ dun/cm$^2$.

15. A method of manufacturing a field effect transistor as in claim 14, further comprising processing said field effect transistor such that said silicon oxide has a residual compressive stress not more than $5 \times 10^8$ dyn/cm$^2$.

16. A method of manufacturing a field effect transistor as in claim 7, wherein the executing of the step of forming said silicon oxide film produces a silicon oxide film having a residual stress not more than $5 \times 10^8$ dyn/cm$^2$.

17. A method of manufacturing a semiconductor device, comprising the steps of:
  forming a polycrystalline silicon film on the major surface of a semiconductor substrate,
  forming a silicon oxide film on said polycrystalline silicon film at a temperature not more than 800° C. to have a residual tensile stress not more than $10^9$ dyn/cm$^2$,
  forming a resist film on said silicon oxide film,
  using said resist film as a mask for selectively removing both said silicon oxide film and said polycrystalline silicon film, wherein the formation of the silicon oxide to have a residual tensile stress not more than $10^9$ dyn/cm$^2$ prevents formation of notches at a lower surface of the polycrystalline silicon film in the step of using said resist film as a mask, and
  further processing said semiconductor device such that said silicon oxide film has a residual compressive stress not more than $10^9$ dyn/cm$^2$.

18. A method of manufacturing a semiconductor device in accordance with claim 17, wherein the residual tensile stress in the silicon oxide film after the forming step is not more than $5 \times 10^8$ dyn/cm$^2$.

19. A method of manufacturing a semiconductor device in accordance with claim 18, wherein the residual compressive stress in the silicon oxide film after the further processing step is not more than $5 \times 10^8$ dyn/cm$^2$.

20. A method of manufacturing a semiconductor device in accordance with claim 17, wherein the residual compressive stress in the silicon oxide film after the further processing step is not more than $5 \times 10^8$ dyn/cm$^2$.

* * * * *